(12) United States Patent
Smith

(10) Patent No.: US 10,614,876 B1
(45) Date of Patent: Apr. 7, 2020

(54) SENSING CHARGE RECYCLING CIRCUITRY

(71) Applicant: Micron Technology, Inc., Boise, ID (US)

(72) Inventor: Scott E. Smith, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/176,891

(22) Filed: Oct. 31, 2018

(51) Int. Cl.

| G11C 11/4091 | (2006.01) |
| G11C 11/4094 | (2006.01) |
| G11C 7/06 | (2006.01) |
| G11C 7/12 | (2006.01) |
| G11C 11/406 | (2006.01) |

(52) U.S. Cl.
CPC .......... *G11C 11/4091* (2013.01); *G11C 7/06* (2013.01); *G11C 7/12* (2013.01); *G11C 11/4094* (2013.01); *G11C 11/40615* (2013.01)

(58) Field of Classification Search
CPC ......... G11C 11/4091; G11C 7/12; G11C 7/06; G11C 11/40615; G11C 11/4094
See application file for complete search history.

(56) References Cited

U.S. PATENT DOCUMENTS

| 6,847,566 B1 * | 1/2005 | Han .................... G11C 7/06 365/203 |
| 2010/0054057 A1 * | 3/2010 | Meterelliyoz ....... G11C 11/4091 365/194 |

\* cited by examiner

*Primary Examiner* — David Lam
(74) *Attorney, Agent, or Firm* — Fletcher Yoder, P.C.

(57) ABSTRACT

A memory device include one or more sections of memory banks. Each of the one or more sections may include multiple sensing amplifiers and a digit line to supply voltages to the sensing amplifiers during a refresh of the respective section. The memory device may also include transmission circuitry configured to transmit excess charge remaining on a first digit line of a first section to a second digit line of a second section after a refresh of the first section and before a refresh of the second section.

18 Claims, 7 Drawing Sheets

SENSING CHARGE RECYCLING CIRCUITRY

BACKGROUND

Field of the Present Disclosure

Embodiments of the present disclosure relate generally to refreshing memory banks of a memory device. More specifically, embodiments of the present disclosure relate to recycling sensing charges between refreshes of different portions of a memory bank.

Description of Related Art

Semiconductor devices (e.g., dynamic random access memory (DRAM) devices) include memory banks that utilize capacitors to store electrical charges indicative of logical ones and zeros. However, the capacitors slowly leak charge. Thus, without intervention, the data stored in the memory banks may be lost. To prevent data loss due to charge leakage, the memory device may refresh data stored in the memory banks using a memory refresh. During a memory refresh, the data is read from a memory bank and rewritten back to the memory bank. However, these refresh operations may consume power with some excess charge remaining on digit lines used to perform the memory refresh after the memory refresh of a portion of a memory bank is completed. This excess charge may be discarded/dissipated after the memory refresh of the portion of the memory bank.

Embodiments of the present disclosure may be directed to one or more of the problems set forth above.

DETAILED DESCRIPTION

Figure 1:
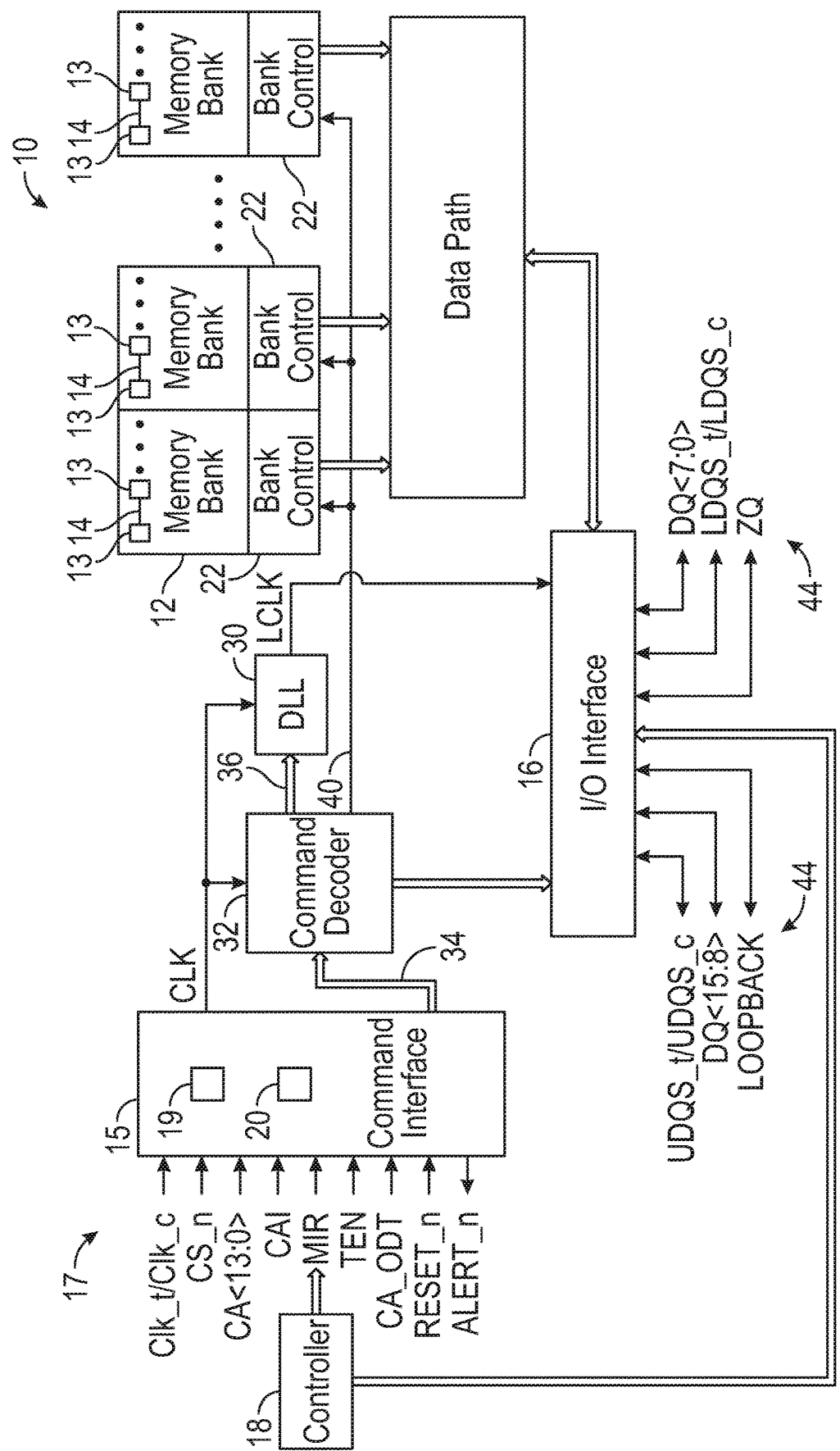
FIG. 1 is a simplified block diagram illustrating certain features of a memory device having one or more memory banks, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As previously noted, memory banks are refreshed in some memory devices, such as dynamic random-access memory (DRAM) devices. Refresh power is a concern on DRAM devices, especially as DRAM devices refresh faster to aid process yield and to deal with tighter timing requirements for refreshing parts. If row redundancy is disabled in a refresh of main and redundant word lines performed separately, the memory device may assert more control over refresh compression and which sections are going to be refreshed. Furthermore, with redundancy disabled during refreshes, consecutive pumps will not return to the same section of a memory bank. This may be taken advantage of by the memory device to organize the pumping order so that a previously accessed section, can have its word line turned off but delaying equalization of the digit lines holding a charge after a refresh of the section has been completed. By doing this, the previously sensed section, still has all of the charge after the memory refresh stored on its digit lines. A next section (e.g., adjacent section in the memory bank) may recycle and use the held charge to begin initial sensing and use additional charge from the power supply to finish off the sensing. With a 6 pump design, that means that the first pump uses full power and then each pump after that may consume about 20% less current to perform sensing using some of the previously sensed digit line charge. In other words, by delaying equalization and passing charge held on a digit line to another digit line before equalization, power consumption in the memory device may be reduced. To perform this sharing, a new sensing signal and shorting device may be used to transfer the charge of the previously used lines of the sense amp to the next region's lines as the initial sensing current and to delay the sensing signals of the next sections activation until after the charge transfer has completed.

Such current recycling offers a way to reduce refresh and self-refresh current. Also, current recycling may be used to lower peak currents for at least a portion of the refresh activations. The power reduction improves system performance by making the memory device wattage lower which translates to less heat generated and better power supply levels. Since power consumption also impacts a self-refresh current, the lower power standby modes may also benefit if used in background refreshes.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with an embodiment, the memory device 10 may be a double-data rate (DDR) synchronous DRAM (SDRAM) device. Moreover, the illustrated memory device 10 is discussed as a DDR type 5 (DDR5) SDRAM device. However, the memory device 10 may pertain to other device types such as a DDR type 4 (DDR4) SDRAM device. Various features of DDR5 SDRAM allow for reduced power consumption, more bandwidth and more storage capacity compared to prior generations of DDR SDRAM, but charge recycling within memory banks 12 as discussed herein may save power for and be applicable to memory devices utilizing prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system. Alternatively, the memory banks 12 may be arranged in any other suitable configuration. Each of the memory banks 12 may include one or more memory units that store information in the memory banks 12. The memory banks 12 may also include one or more sections 13 of memory units (e.g., row address section 0 (RA0)) with charge recycling circuitry 14 to interconnect the sections 13 to recycle charge after completion of a refresh of a section 13 before equalizing charge on lines of the section 13.

The memory device 10 may include a command interface 15 and an input/output (I/O) interface 16. The command interface 15 is configured to provide a number of signals (e.g., signals 17) from an external device, such as a processor or controller 18. The processor or controller 18 may provide various signals 17 to the memory device 10 to facilitate the transmission and receipt of data to be written to or read from the memory device 10.

As will be appreciated, the command interface 15 may include a number of circuits, such as a clock input circuit 19 and a command address input circuit 20, for instance, to ensure proper handling of the signals 17 to cause refreshes and/or other operations on the memory banks 12. The command interface 15 may receive one or more clock signals from an external device. Generally, double data rate (DDR) memory utilizes a differential pair of system clock signals, referred to herein as the true clock signal (Clk_t) and the bar clock signal (Clk_c). The positive clock edge for DDR refers to the point where the rising true clock signal Clk_t crosses the falling bar clock signal Clk_c, while the negative clock edge indicates that transition of the falling true clock signal Clk_t and the rising of the bar clock signal Clk_c. Commands (e.g., read command, write command, etc.) are typically entered on the positive edges of the clock signal and data is transmitted or received on both the positive and negative clock edges.

The clock input circuit 19 receives the true clock signal (Clk_t) and the bar clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 15 using the clock signals (Clk_t and Clk_c). The command interface may include a command address input circuit 20 which is configured to receive and transmit the commands to provide access to the memory banks 12, through the command decoder 32, for instance. In addition, the command interface 15 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 15 may be configured to receive a number of other command signals. For instance, a command/address on die termination (CA_ODT) signal may be provided to facilitate proper impedance matching within the memory device 10. A reset command (RESET_n) may be used to reset the command interface 15, status registers, state machines and the like, during power-up for instance. The command interface 15 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 15 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the TO interface 16. More specifically, the data may be sent to or retrieved from the memory banks 12 over the datapath 46, which includes multiple bi-directional data buses. Data TO signals are generally transmitted and received in one or more bi-directional data busses.

For certain memory devices, such as a DDR5 SDRAM memory device, the TO signals may be divided into upper and lower bytes. For instance, for a x16 memory device, the TO signals may be divided into upper and lower TO signals (e.g., DQ<15:8> and DQ<7:0>) corresponding to upper and lower bytes of the data signals, for instance.

An impedance (ZQ) calibration signal may also be provided to the memory device 10 through the TO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the TO pins.

In addition, a loopback signal (LOOPBACK) may be provided to the memory device 10 through the 10 interface 16. The loopback signal may be used during a test or debugging phase to set the memory device 10 into a mode wherein signals are looped back through the memory device 10 through the same pin. For instance, the loopback signal may be used to set the memory device 10 to test the data output of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
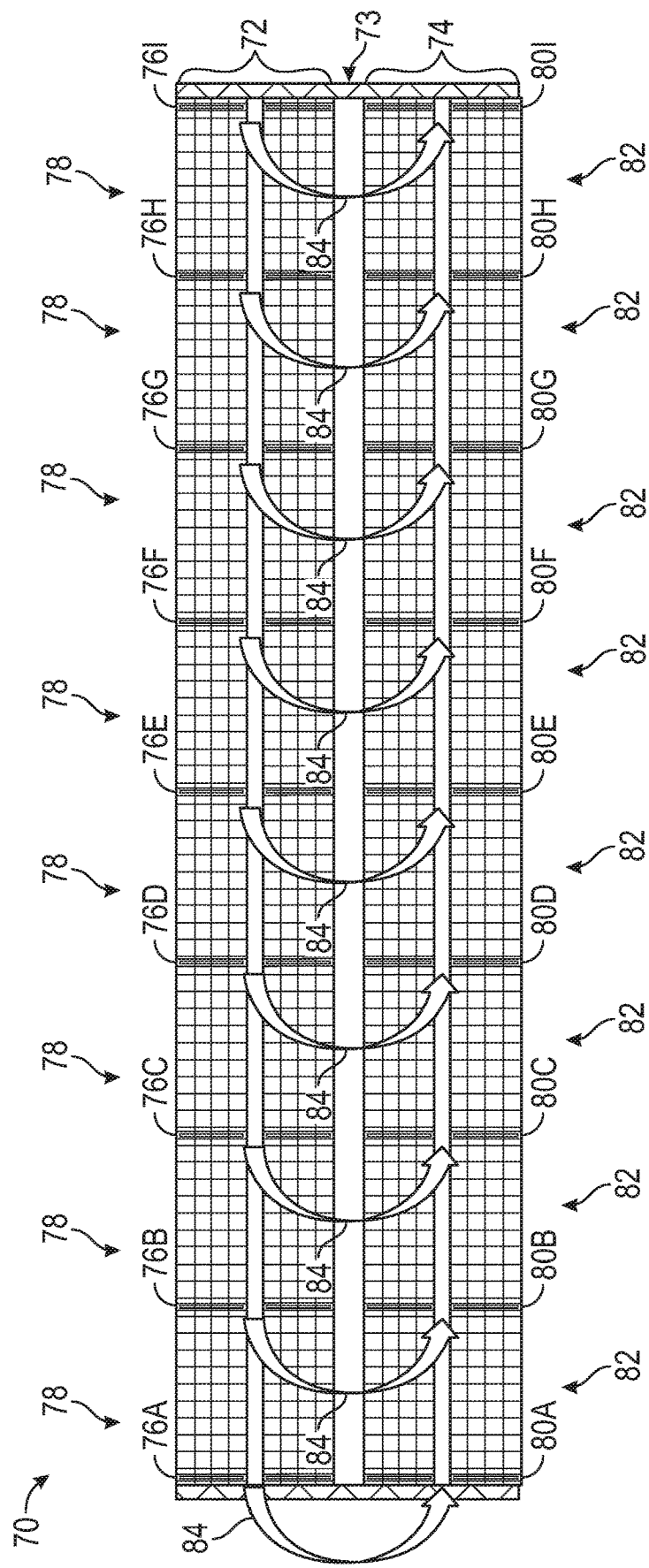
FIG. 2 is a diagram of a portion of a memory bank of the one or more memory banks of FIG. 1, in accordance with an embodiment.

FIG. 2 is a diagram of a portion 70 of a memory bank 12 includes a section 72 of the memory bank 12, a global row 73, and a section 74 of the memory bank. The global row 73 may include a space between the sections 72 and 74 and may include transmission circuitry for routing data to/from memory units of the sections 72 and/or 74. Furthermore, as discussed below, the global row 73 may include recycling circuitry that transmits recycled charge from the section 72 to section 74.

As illustrated, the section 72 includes word lines 76 (e.g., word lines 76A-76I) that each carry data and transmits data to one or more sensing amplifiers 78. The sensing amplifiers 78 driven by each word line 76 may be on one or both sides of the word line. For instance, the word line 76E may drive some sensing amplifiers 78 to the left of the word line 76 and some sensing amplifiers 78 to the right of the word line 76. Furthermore, the number of sensing amplifiers 78 on either side of the word line 76 may be different. For example, word line 76E may drive five sensing amplifiers 78 columns to the left of the word line 76E and four sensing amplifiers 78 to the right of the word line 76E. Furthermore, regardless of what data is included in the word line 76, approximately half of the memory units of the section 72 are charged high via the corresponding sensing amplifiers 78 and the remainder are charged low using different corresponding sensing amplifiers 78. For instance, at least some of the word lines 76 (e.g., 76E) may drive sensing amplifiers 78 on a first side (e.g., left) high and sensing amplifiers 78 on a second side (e.g., right) of the word line 76 low.

The high voltage (VARY) and the low voltage (VSS) are supplied to the corresponding sensing amplifiers 78 using digit lines. The digit lines may have a relatively high capacitance compared to the memory cells. Accordingly, after charging the cells via the sensing amplifiers 78, at least some of the charge (e.g., a portion of VARY) may remain on the digit lines. When the refresh of the section 72 is completed, this remaining charge may be discarded/dissipated when the digit lines equalize voltage between VARY and VSS. However, in accordance with the presently described embodiment, the equalization of the voltages of the digit lines may be delayed to hold the charge on the digit line for the section 72. During this delay, a transmission 84 of the charge may be passed to the section 74 from the section 72 before the charge on the digit lines of the section 72 is dissipated.

Similar to the section 72, the section 74 includes word lines 80 (e.g., word lines 80A-801) that each carry data and transmits data to one or more sensing amplifiers 82. The sensing amplifiers 82 driven by each word line 80 may be on one or both sides of the word line. For instance, the word line 80E may drive some sensing amplifiers 82 to the left of the word line 76 and some sensing amplifiers 82 to the right of the word line 80. Furthermore, the number of sensing amplifiers 82 on either side of the word line 80 may be different. For example, word line 80E may drive five sensing amplifiers 82 columns to the left of the word line 80E and four sensing amplifiers 82 to the right of the word line 80E. Furthermore, regardless of what data is included in the word line 80, approximately half of the memory units of the section 74 are charged high via the corresponding sensing amplifiers 78 and the remainder are charged low using different corresponding sensing amplifiers 78. For instance, at least some of the word lines 80 (e.g., 80E) may drive sensing amplifiers 82 on a first side (e.g., left) high and sensing amplifiers 82 on a second side (e.g., right) of the word line 80 low.

Also similar to the section 72, the VARY voltage and VSS voltage are supplied to the corresponding sensing amplifiers 82 using digit lines of the section 74. Again, the digit lines may have a relatively high capacitance compared to the memory cells. Accordingly, after charging the cells via the sensing amplifiers 82, at least some of the charge (e.g., a portion of VARY) may remain on the digit lines of the section 74. When the refresh of the section 74 is completed, a transmission of the charge may be passed to a next section (not shown) from the section 74 before the charge on the digit lines of the section 74 is dissipated. In this way, the entire memory bank 12 may be refreshed with each subsequent section utilizing at least some charge from a previous section during a refresh.

Figure 3:
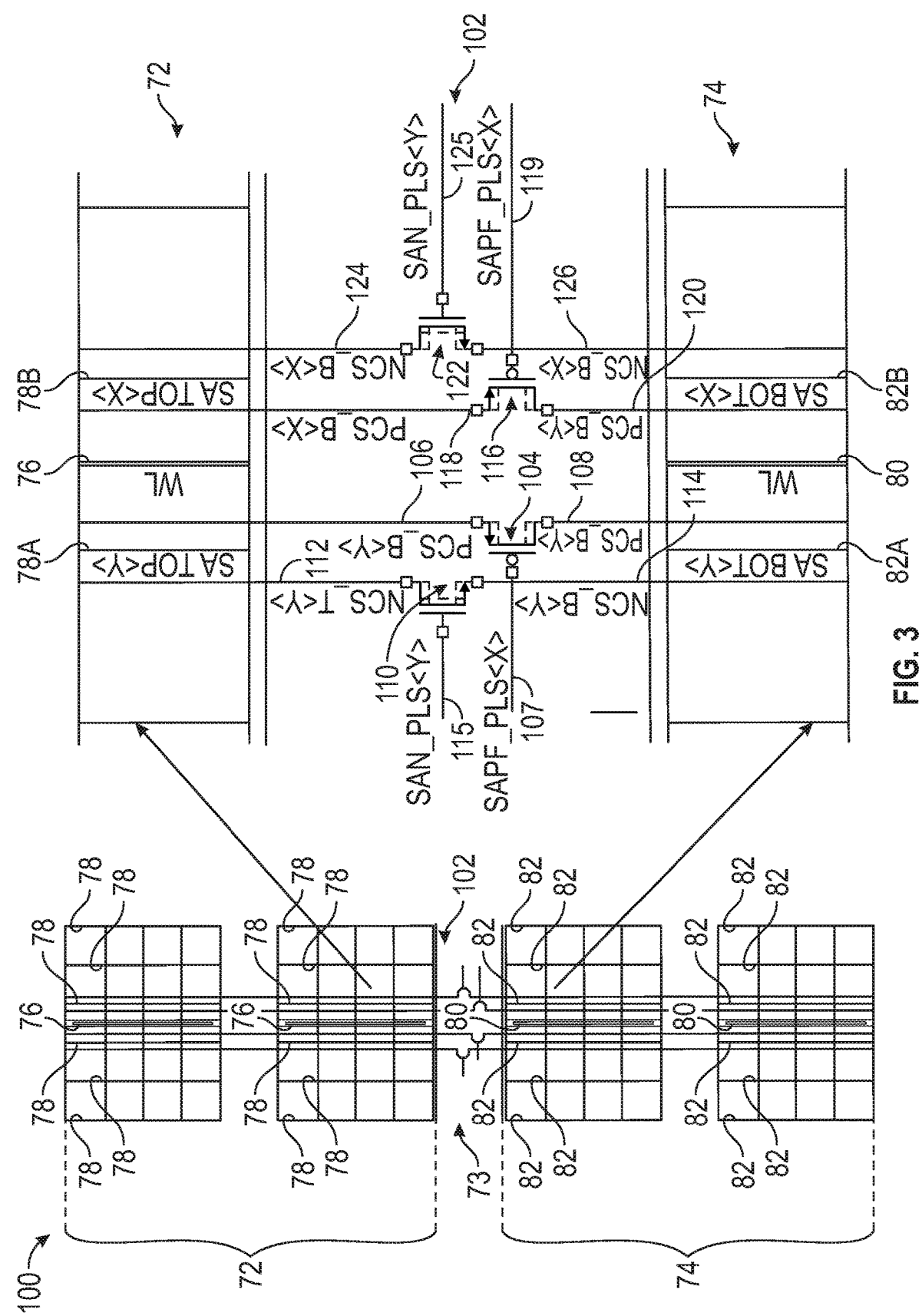
FIG. 3 is a diagram of a portion of the portion of the memory bank of FIG. 2 including transmission circuitry between sections of the memory bank of FIG. 2, in accordance with an embodiment.

FIG. 3 is a simplified schematic diagram of a portion 100 of the portion 70 of the memory bank 12. As illustrated, the portion 100 includes transmission circuitry 102 in the global row 73 and that is used to transmit charge from digit lines of the section 72 to digit lines of the section 74.

As illustrated, the transmission circuitry 102 includes a transistor 104 that receives a p-channel supply (PCS) 106 to charge a first digit line. The PCS 106 supplies a first voltage (e.g., VARY) to the sensing amplifier 78A and to the transmission circuitry 102. In response to a sensing amplifier PCS pulse (SAPF_PLS) signal 107, the transistor 104 may short the PCS 106 to a PCS 108 of the sensing amplifier 82A.

Furthermore, the transmission circuitry 102 also includes a transistor 110 that receives an n-channel supply (NCS) 112 to a second digit line. The NCS 112 supplies a second voltage (e.g., VSS) to the sensing amplifier 82A. In response to a sensing amplifier NCS pulse (SAN_PLS) signal 113, the transistor 110 may short the NCS 112 to an NCS 114 of the sensing amplifier 82A.

Each sensing amplifier may have corresponding shorting transistors. For example, the transmission circuitry 102 includes a transistor 116 that receives a PCS 118 to charge a third digit line. As a note, the first and third digit lines may carry opposite polarity voltages. In some embodiments, the PCS 118 and the PCS 106 may be different supplies, but in some embodiments, the PCS 118 and the PCS 106 may be the same supply. The PCS 118 supplies the first voltage (e.g., VARY) to the sensing amplifier 78B and to the transmission circuitry 102. In response to a sensing amplifier PCS pulse (SAPF_PLS) signal 119, the transistor 116 may short the PCS 118 to a PCS 120 of the sensing amplifier 82B.

Furthermore, the transmission circuitry 102 also includes a transistor 122 that receives an n-channel supply (NCS) 124 to a fourth digit line. As a note, the second and fourth digit lines may carry opposite polarity voltages. In some embodiments, the NCS 124 and the NCS 112 may be different supplies, but in some embodiments, the NCS 124 and the NCS 112 may be the same supply. The NCS 124 supplies the second voltage (e.g., VSS) to the sensing amplifier 82B. In response to a sensing amplifier NCS pulse (SAN_PLS) signal 125, the transistor 122 may short the NCS 124 to an NCS 126 of the sensing amplifier 82B.

The shorts via the transistors provide a route for charges on at least one digit line of the section 72 to pass from the at least one digit line of the section 72 to corresponding digit line(s) of the section 74 before the charges on the digit lines of the section 72 are equalized.

Figure 4:
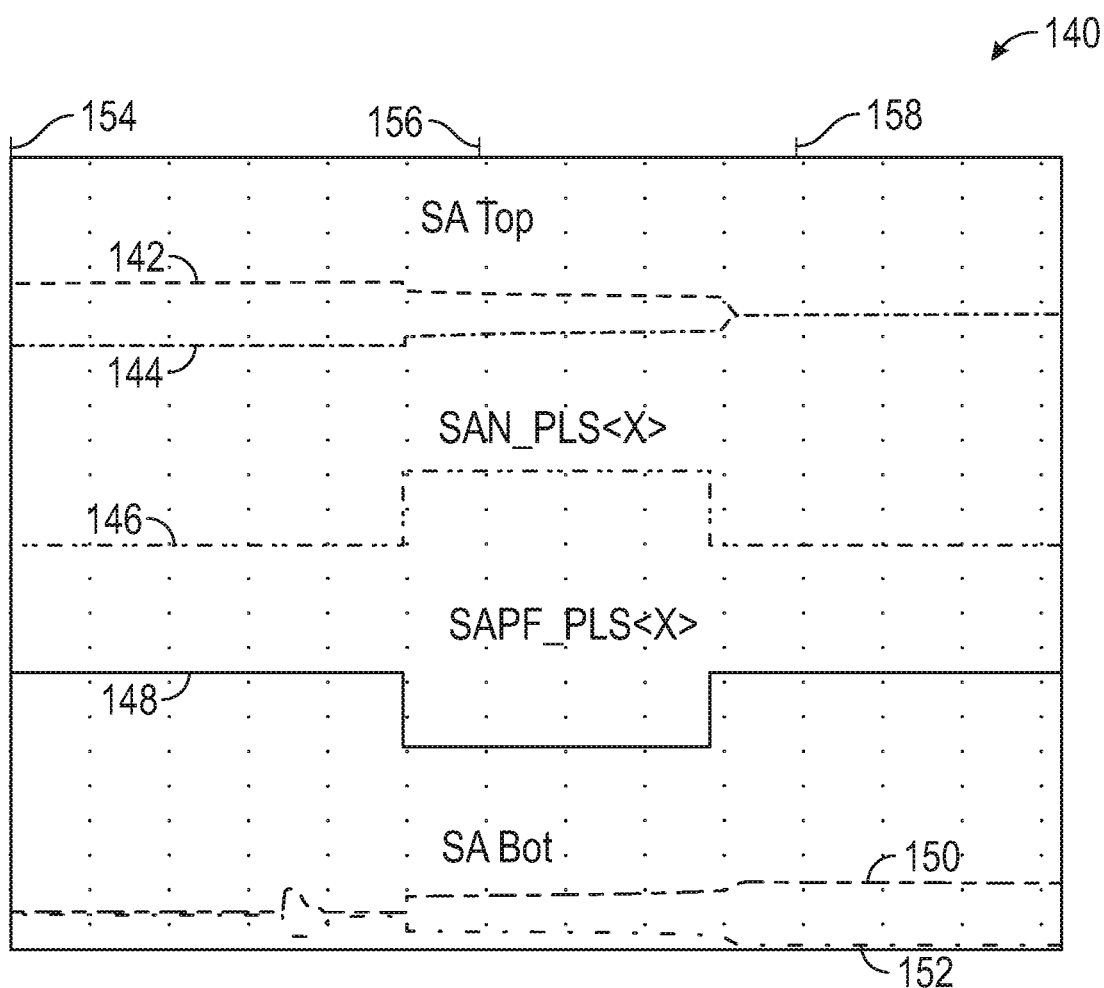
FIG. 4 is a timing diagram of signals used by the transmission circuitry of FIG. 3 to recycle charge between the sections of the memory bank, in accordance with an embodiment.

For instance, FIG. 4 illustrates a graph 140 depicting charge recycling between sections of the memory bank 12. Specifically, the graph 140 illustrates an example high digit line voltage 142 and an example low digit line voltage 144 of the section 72. The high digit line voltage 142 may correspond to a voltage on the PCS 106, and the low digit line voltage 144 may correspond to a voltage on the NCS 112. The graph 140 also illustrates an example SAN_PLS signal 146 and an example SAPF_PLS signal 148. Additionally, the graph 140 illustrates an example high digit line voltage 150 and an example low digit line voltage 152 of the section 74. The high digit line voltage 150 may correspond to a voltage on the PCS 108, and the low digit line voltage 152 may correspond to a voltage on the NCS 114.

As illustrated, at time 154, a refresh of the section 72 may be active with the high digit line voltage 142 being at a logic high voltage (VARY) while the low digit line voltage 144 is at a logic low voltage (VSS). At time 156, one or more word lines 76 corresponding to a sensing amplifier 78 stop sending data, but the high digit line voltage 142 and the low digit line voltage 144 have equalization delayed until time 158. Due to the assertion of the SAPF_PLS signal 148 between time 156 and 158, a transistor (e.g., transistor 104) shorts a digit line from the section 72 to a corresponding digit line in the section 74. Due to this short and the high digit line voltage 142 at time 156 (VARY) being greater than an equalized voltage of the high digit line voltage 150 at time 156, charge from the high digit line voltage 142 is transmitted to the high digit line voltage 150 causing the high digit line voltage 142 to decrease while the high digit line voltage 150 increases. Similarly, due to the assertion of the SAN_PLS signal 146 at time 156, a transistor (e.g., transistor 110) may create a short between digit lines in the section 72 and the section 74. Due to this short and the low digit line voltage 144 being lower (VSS) than the equalized voltage of the low digit line voltage 152 at time 156, charge from the low digit line voltage 152 may be transmitted from the low digit line voltage 152 to the low digit line voltage 144 causing the low digit line voltage 144 to increase while the low digit line voltage 152 decreases. At time 158, the recycling pulse signals (e.g., SAN_PLS signal 146 and the SAPF_PLS signal 148) are de-asserted, an equalization signal is used to cause the high digit line voltage 142 and the low digit line voltage 144 to converge at the equalization voltage. In some embodiments, the equalization voltage is the average of VARY and VSS.

Figure 5:
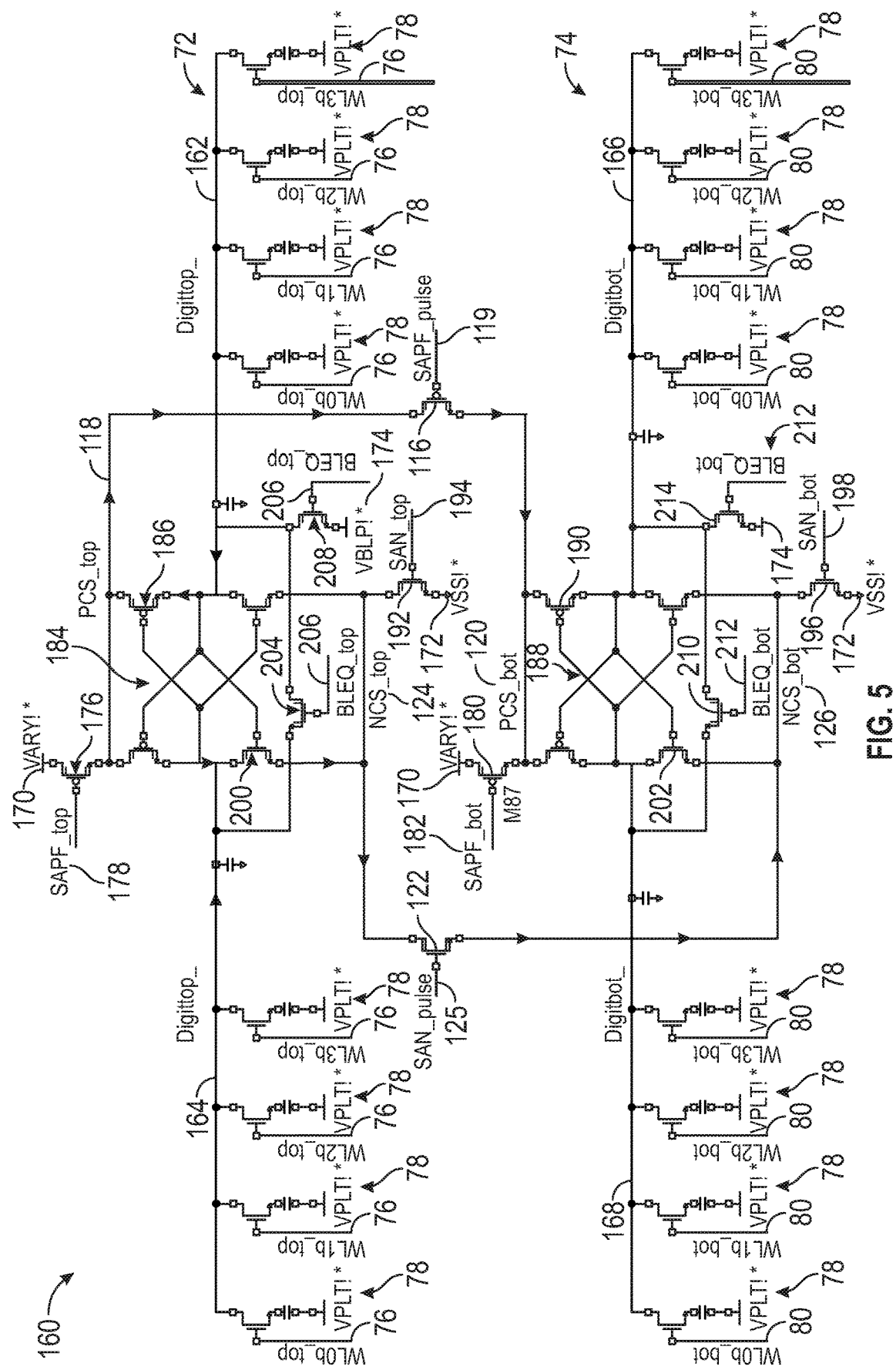
FIG. 5 is a schematic diagram of the transmission circuitry of FIG. 3, in accordance with an embodiment.

FIG. 5 is a detailed schematic of transmission circuitry 160 that may be an embodiment of the transmission circuitry 102. The transmission circuitry 160 is coupled to digit lines 162 and 164 from the section 72 and to digit lines 166 and 168 from the section 74. The digit lines 162, 164, 166, and 168 carry voltages to word lines 76 each coupled to one or more sensing amplifiers 78. The digit lines 162, 164, 166, and 168 each carry a voltage based on at least one of an array voltage (VARY) 170, a supply voltage (VSS) 172, and a bit line pre-charge voltage (VBLP) 174. The VARY 170 is at a level sufficiently high enough to set each high data bit in the memory units to a logic high level while the VSS 172 is used to set the memory units to a low level. The VBLP 174 is a level (e.g., mid-point between the VARY 170 and the VSS) that pre-charges the digit lines to ease the transition of the digit lines 162, 164, 166, and 168 to the VARY 170 or the VSS 172.

A transistor 176 may utilize a SAPF top signal 178 to selectively couple the PCS 118 to the VARY 170 for use in the section 72. Similarly, a transistor 180 may utilize a SAPF bot signal 182 to selectively couple the PCS 120 to the VARY 170 for use in the section 74. Similar arrangements may be used for other PCS lines in the memory bank to couple digit lines to the VARY 170 via PCS lines.

A transistor network 184 may be used to selectively couple the digit line 162 to the PCS 118. In other words, a transistor 186 of the transistor network 184 may be used to pull the digit line 162 up to the level of the VARY 170 via the PCS 118. Similarly, a transistor network 188 may be used to selectively couple the digit line 166 to the PCS 120. In other words, a transistor 190 of the transistor network 188 may be used to pull the digit line 166 up to the level of the VARY 170 via the PCS 120.

Moreover, a transistor 192 may utilize a SAN top signal 194 to selectively couple the NCS 124 to the VSS 172 for use in the section 72. Similarly, a transistor 196 may utilize a SAN bot signal 198 to selectively couple the NCS 126 to the VSS 172 for use in the section 74. Similar arrangements may be used for other NCS lines in the memory bank 12 to couple corresponding digit lines to the VSS 172 via NCS lines.

The transistor network 184 may also be used to selectively couple the digit line 164 to the NCS 124. In other words, a transistor 200 of the transistor network 184 may be used to pull the digit line 164 down to the level of the VSS 172 via the NCS 124. Similarly, the transistor network 188 may be used to selectively couple the digit line 168 to the NCS 126. In other words, a transistor 202 of the transistor network 188 may be used to pull the digit line 168 down to the level of the VSS 172 via the NCS 126.

A transistor 204, based on an equalization signal 206, may be used to selectively couple the digit lines 162 and 164 together to cause the digit lines 162 and 164 to equalize their voltages. Additionally, a transistor 208 may tie the equalized digit lines 162 and 164 to the VBLP 174 based on the equalization signal 206.

Similarly, a transistor 210, based on an equalization signal 212, may be used to selectively couple the digit lines 166 and 168 together to cause the digit lines 166 and 168 to equalize their voltages. Additionally, a transistor 214 may tie the equalized digit lines 166 and 168 to the VBLP 174 based on the equalization signal 212.

Figure 6:
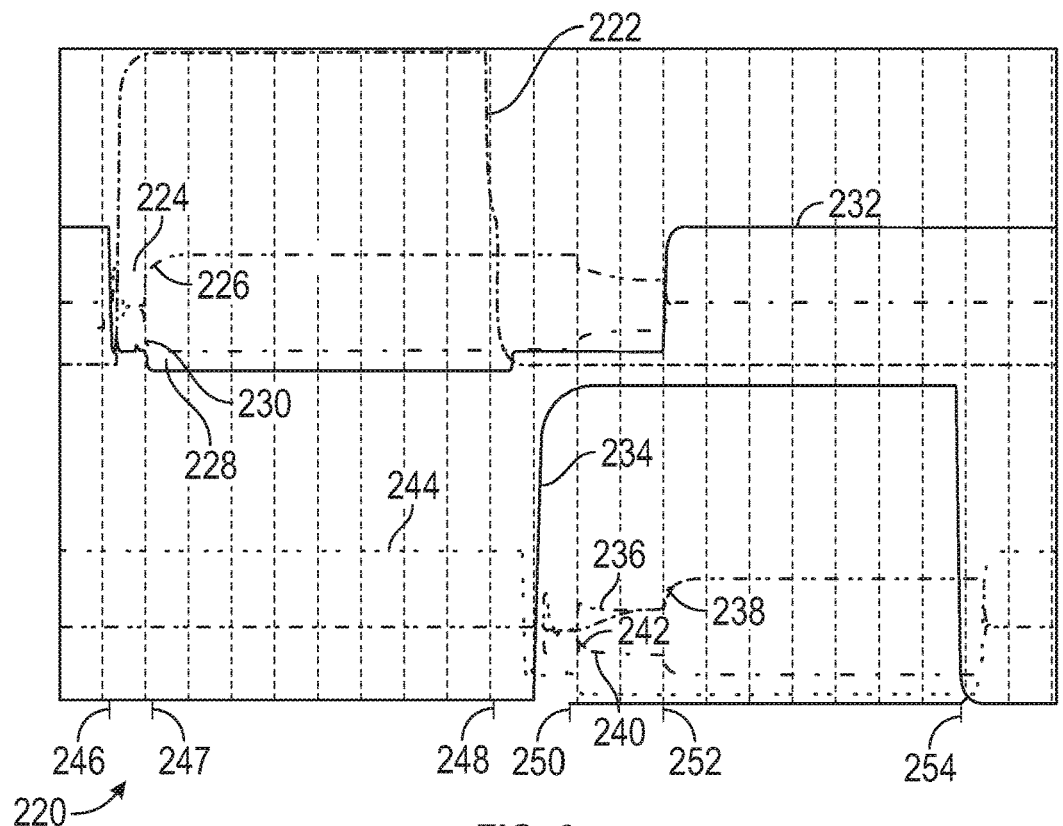
FIG. 6 is a timing diagram of signals in the transmission circuitry of FIG. 5, in accordance with an embodiment.

FIG. 6 is a graph 220 illustrating charge recycling between sections (e.g., sections 72 and 74). The graph 220 illustrates levels of a word line voltage 222, a PCS voltage 224, a digit line voltage 226 corresponding to the PCS voltage 224, an NCS voltage 228, a digit line voltage 230 corresponding to the NCS voltage 228, and an equalization signal 232 for a first section (e.g., the section 72). For example, the word line voltage 222 may correspond to a voltage on a word line 76 in the section 72, the PCS voltage 224 may correspond to a voltage on the PCS 118, the digit line voltage 226 may correspond to a voltage on the digit line 162, the NCS voltage 228 may correspond to the NCS 124, and the digit line voltage 230 may correspond to the digit line 164.

The graph 220 also illustrates levels of a word line voltage 234, a PCS voltage 236, a digit line voltage 238 corresponding to the PCS voltage 236, an NCS voltage 240, a digit line voltage 242 corresponding to the NCS voltage 240, and an equalization signal 244 for a second section (e.g., the section 74). For example, the word line voltage 234 may correspond to a voltage on a word line 76 in the section 74, the PCS voltage 236 may correspond to a voltage on the PCS 120, the digit line voltage 238 may correspond to a voltage on the digit line 166, the NCS voltage 240 may correspond to the NCS 126, and the digit line voltage 242 may correspond to the digit line 168.

As illustrated the PCS voltage 224 and the PCS voltage 236 may respectively drive the digit line voltage 226 and the digit line voltage 238 when respective PCS lines and digit lines are coupled together via a transistor. Furthermore, the NCS voltage 228 and 240 may respectively drive the digit line voltages 230 and 242 when respective NCS lines and digit lines are coupled together via a transistor.

During a first period starting at time 246, the word line voltage 222 transitions high to start a refresh of the first section. Also, at time 246, the equalization signal 232 transitions low to stop equalizing the digit line voltages 226 and 230. At a subsequent time 247, the PCS voltage 224 transitions high (e.g., VARY). For instance, the transition high may be due to an assertion of the SAPF top signal 178. Also, at the time 247, the digit line voltage 226 may transition high with the PCS voltage 224. Also at the time 247, the NCS voltage 228 may transition low (e.g., VSS). For instance, the transition low may be due to an assertion of the SAN top signal 194. Also, at the time 247, the digit line voltage 230 may transition low with the NCS voltage 228.

At time 248, the word line voltage 222 may transition low (e.g., VSS). At this time, the equalization signal 232 may be reasserted to equalize the PCS voltage 224 and the NCS voltage 228 to dissipate charge from the PCS and/or NCS lines. However, by delaying equalization via the equalization signal 232 and instead recycling charge by passing the charge between sections, power consumption of the memory bank 12 and the memory device 10 may be reduced.

At time 250, the SAPF top signal 178 and the SAN top signal 194 are deasserted to stop driving the PCS 118 and the NCS 124 while the word line voltage 234 has transitioned high as a refresh of second section of the memory bank 12. Furthermore, the SAPF_pulse 119 and the SAN_pulse 125 may be asserted to short the PCS 118 to the PCS 120 and to short the NCS 124 to the NCS 126. Due to the shorting of these lines together while the PCS 120 and the NCS 126 are undriven due to lack of assertion of the SAPF bot signal 182, the SAN bot signal 198, and the equalization signal 244, the PCS voltage 224 (and, consequently, the digit line voltage 226) decreases while the PCS voltage 236 (and, consequently, the digit line voltage 238) increases. Additionally, the NCS voltage 228 (and, consequently, the digit line voltage 230) increases while the NCS voltage 240 (and, consequently, the digit line voltage 242) decreases. In other words, in some embodiments, after time 252, the charge from the PCS 118 and the NCS 124 may be used to drive sensing of the section 74 until the PCS 118 and the NCS 124 are driven using the SAPF bot signal 182 and the SAN bot signal 198 at time 252.

After a sufficient time to transmit the charge at the time 252, the SAPF_pulse 119 and the SAN_pulse 125 are deasserted while the equalization signal 232 is asserted causing the PCS voltage 224, the digit line voltage 226, the NCS voltage 228, and the digit line voltage 230 to equalize to the VBLP 174. Also, at time 252, the PCS voltage 236 (and digit line voltage 238) and the NCS voltage 240 (and digit line voltage 242) are respectively driven to the VARY 170 and the VSS 172 due to respective assertions of the SAPF bot signal 182 and the SAN bot signal 198.

At a time 254, a refresh of the second portion may have been completed, and the PCS voltage 236 (and digit line voltage 238) and the NCS voltage 240 (and digit line voltage 242) return to being undriven. Also, as illustrated, at time 254, the equalization signal 244 may be asserted to cause the PCS voltage 236 (and digit line voltage 238) and the NCS voltage 240 (and digit line voltage 242) to equalize to the VBLP 174. In some embodiments, the charge remaining on the PCS 120 and/or the NCS 126 may be recycled and transmitted to a next section similar to how the charge is transmitted from the section 72 to the section 74 rather than dissipated by delaying assertion of the equalization signal 244.

Figure 7:
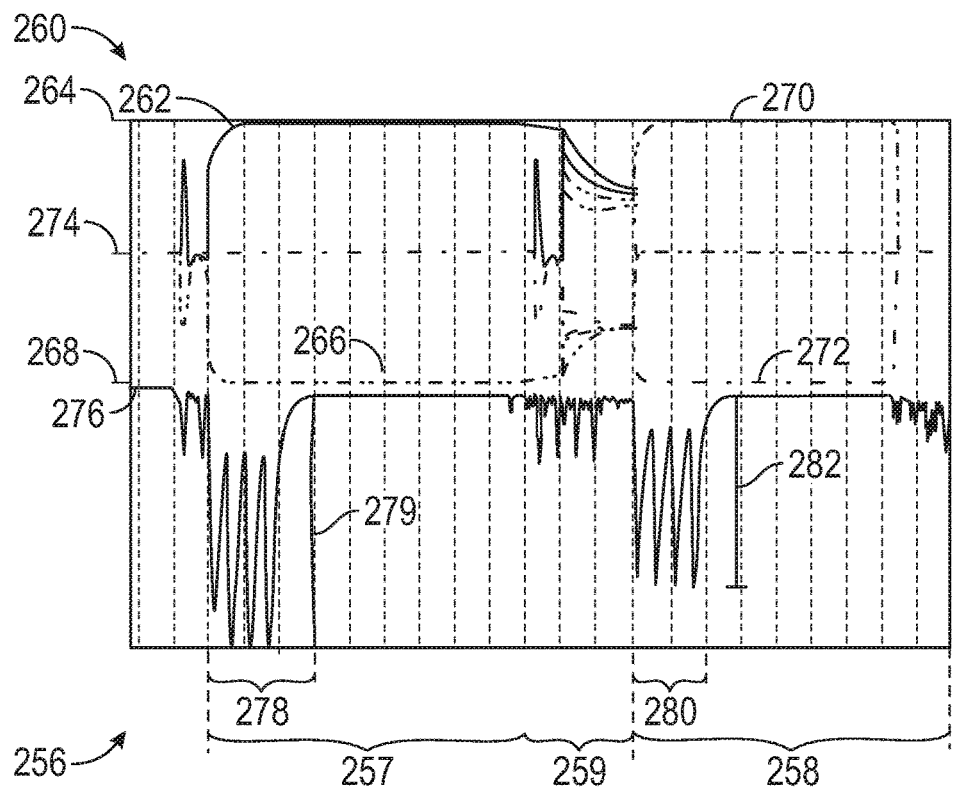
FIG. 7 is a graph of current fluctuations with and without charge recycling between sections of the memory bank of FIG. 2, in accordance with an embodiment.

FIG. 7 is a graph 256 showing voltages of the various voltages of memory bank 12 during refresh periods 257 and 258. The refresh period 257 corresponds to a refresh of a first portion, such as a word line in a section (e.g., section 72) of a bank group of memory banks 12. The refresh period 258 corresponds to a refresh of a second portion, such as a word line in another section (e.g., section 74) of the bank group of memory banks 12. During a transmission period 259, charge is passed between sections.

At time 260 at the beginning of the refresh period 257, a PCS 262 transitions high to a level 264 (e.g., the VARY 170) while an NCS 266 transitions low to a level 268 (e.g., the VSS 172). At time 260 at the beginning of the refresh period 257, a PCS 262 transitions high to a level 264 (e.g., the VARY 170) while an NCS 266 transitions low to a level 268 (e.g., the VSS 172). Also, at the time 260, a PCS 270 and an NCS 272 are equalized to a voltage level 274 (e.g., the VBLP 174).

During an initial portion 278 of the refresh period 257, multiple banks (e.g., 4 banks) may be refreshed. Each of these refreshes may consume power causing a current 276 of the VARY 170 to drop during the initial portion 278 during each bank refresh initiation (e.g., 4 spikes). This variation may have a current drop 279 corresponding to no charge recycling current drop.

During an initial portion 280 of the refresh period 258, multiple other banks (e.g., 4 banks) may be refreshed. Each of these refreshes may consume power causing the current 276 of the VARY 170 to drop during the initial portion 280 during each bank refresh initiation (e.g., 4 spikes). This variation may have a current drop 282 corresponding to charge recycling current drop. As illustrated, the current drop 282 may be smaller than the current drop 279 accounting for a current savings attributable to charge recycling. For example, the current savings may include 20 percent savings over the consumption occurring without power recycling.

Figure 8:
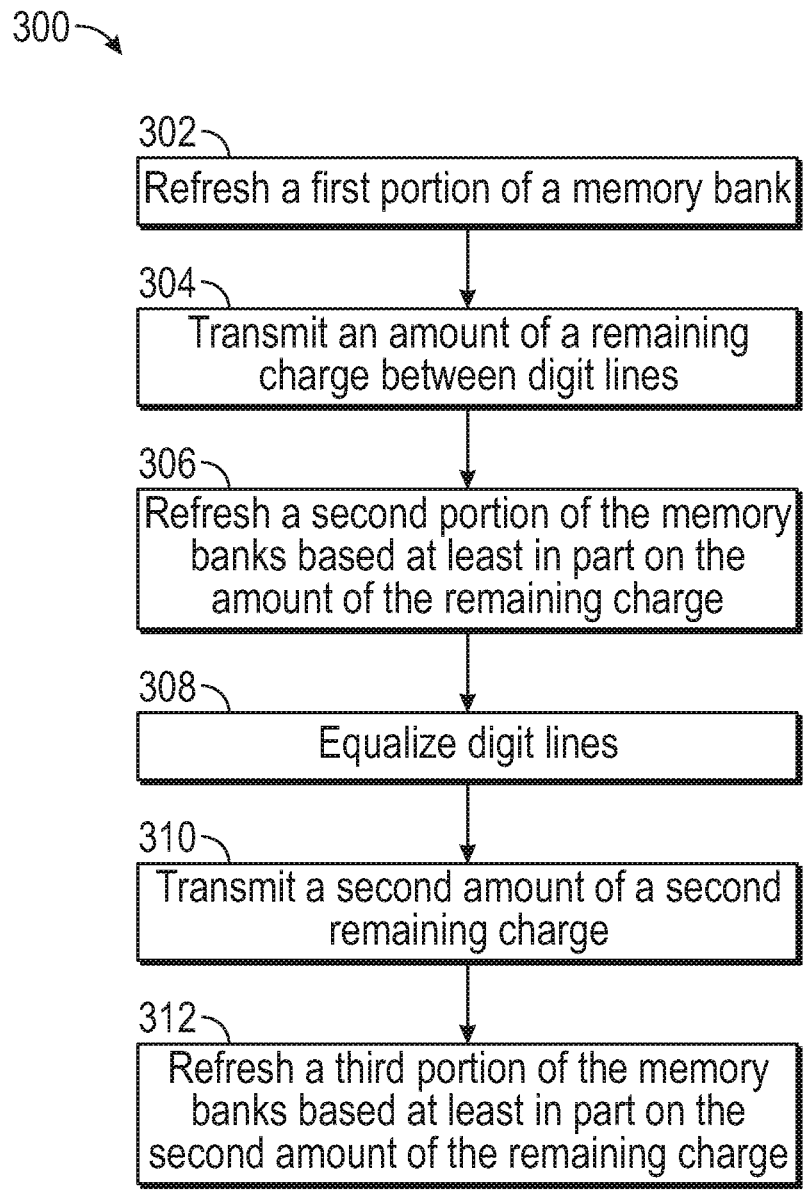
FIG. 8 is a flow diagram of a charge recycling process performed by the memory bank of FIG. 2, in accordance with an embodiment.

FIG. 8 is a process 300 used to recycle charge between sections of memory bank(s) 12 of a memory device 10 during a refresh of the memory bank(s) 12. The process 300 includes the memory device 10 refreshing a first portion of memory banks 12 via a first digit line (block 302). The memory device 10 utilizes transmission circuitry 102 to transmit an amount of a remaining charge from the first digit line of the first portion to a second digit line of a second portion of the memory banks (block 304). Transmitting the amount includes shorting the first digit line to the second digit line via a transistor. For instance, the short may occur via a transistor (e.g., transistor 104) to couple local supplies (e.g., PCS 106 and the PCS 108) together. The local supplies may be used to drive the first digit line using an external supply when refreshing and may be decoupled from the external supply when transmitting the charge. The remaining charge remains on the first digit line after refreshing the first portion due to a difference between capacitance of the sensing amplifiers 78 and the first digit line. The memory device 10 then refreshes the second portion of the memory banks 12 based at least in part on the amount of the remaining charge (block 306). In some embodiments, the memory device 10 may also equalize the first digit line with a third digit line of the first portion after the amount of the remaining charge has been transmitted from the first digit line and the second digit line (block 308).

In some embodiments, once the refresh is completed on the second section, the charge may be passed along again. In such embodiments, the memory device 10 transmits a second amount of a second remaining charge from the second digit line of the second portion to a third digit line of a third portion of the memory banks 12 (block 310). The remaining charge remains on the second digit line after refreshing the second portion. The memory device 10 then refreshes the third portion of the memory banks based at least in part on the second amount of the remaining charge (block 312).

Although the foregoing discusses various logic-low and/or logic-high assertion polarities, at least some of these polarities may be inverted in some embodiments. Furthermore, in some embodiments, logic gates as discussed herein may be replaced with similar logical functions, such as p-channel transistors replaced with n-channel transistors with opposite polarity driving signals (e.g., via inverters) and/or other similar changes.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A memory device, comprising:
 a first section of memory banks comprising:
  a first plurality of sensing amplifiers;
  a first digit line configured to supply a first voltage to the first plurality of sensing amplifiers during a refresh of the first section;
 a second section of memory banks comprising:
  a second plurality of sensing amplifiers; and
  a second digit line configured to supply the first voltage to the second plurality of sensing amplifiers during a refresh of the second section; and
 transmission circuitry configured to transmit excess charge remaining on the first digit line to the second digit line after the refresh of the first section and before the refresh of the second section, wherein the transmission circuitry comprises a plurality of parallel connections that selectively couple together the first section to the second section to transmit a plurality of excess charges in parallel.

2. The memory device of claim 1, wherein the first section of memory banks comprises a supply configured to be selectively driven by an array voltage supply and is configured to power the first digit line during the refresh of the first section and to be undriven by the array voltage supply when the excess charge is transmitted to the second digit line.

3. The memory device of claim 1, wherein the second section of the memory banks comprises a supply configured to be selectively driven by an array voltage supply and is configured to power the second digit line using the array voltage supply during a first portion of the refresh of the second section.

4. The memory device of claim 3, wherein the supply is configured to drive the second digit line using the excess charge during a second portion of the refresh of the second portion.

5. The memory device of claim 1, wherein the first and second sections are adjacent sections in a memory bank of the memory banks.

6. The memory device of claim 1, wherein the first and second sections are not adjacent sections in a memory bank of the memory banks.

7. The memory device of claim 1, wherein,
the first section comprises:
a third plurality of sensing amplifiers;
a third digit line configured to supply a second voltage to the third plurality of sensing amplifiers during the refresh of the first section; and
the second section of memory banks comprising:
a fourth plurality of sensing amplifiers; and
a fourth digit line configured to supply the second voltage to the fourth plurality of sensing amplifiers during the refresh of the second section.

8. The memory device of claim 7, wherein the transmission circuitry is configured to transmit charge between the third digit line and the fourth digit line after the refresh of the first section and before the refresh of the second section.

9. The memory device of claim 8, wherein the second voltage comprises VSS, and the first section of memory banks comprises a supply configured to be selectively driven by a VSS supply and is configured to drive the third digit line to VSS during the refresh of the first section and to be undriven by the VSS supply when the excess charge is transmitted between the third and fourth digit lines.

10. The memory device of claim 8, wherein the second voltage comprises VSS, and the second section of the memory banks comprises a supply configured to be selectively driven by a VSS supply and is configured to drive the fourth digit line using the VSS supply during a first portion of the refresh of the second section.

11. The memory device of claim 10, wherein the supply is configured to drive the fourth digit line using the transmitted charge between the third and fourth digit lines during a second portion of the refresh of the second portion.

12. A method comprising
refreshing a first portion of memory banks via a first digit line;
transmitting an amount of a remaining charge from the first digit line of the first portion to a second digit line of a second portion of the memory banks, wherein the remaining charge remains on the first digit line after refreshing the first portion;
refreshing the second portion of the memory banks based at least in part on the amount of the remaining charge;
transmitting a second amount of a second remaining charge from the second digit line of the second portion to a third digit line of a third portion of the memory banks, wherein the remaining charge remains on the second digit line after refreshing the second portion; and
refreshing the third portion of the memory banks based at least in part on the second amount of the second remaining charge.

13. The method of claim 12, wherein transmitting the amount of the remaining charge comprises shorting the first digit line to the second digit line.

14. The method of claim 13, wherein shorting the first digit line to the second digit line comprises shorting the first digit line to the second digit line via first and second local supplies of the respective first and second portions.

15. The method of claim 14, wherein refreshing the first portion comprises driving first local supply using an additional supply.

16. The method of claim 15, wherein transmitting the amount of the remaining charge comprises decoupling the first local supply from the additional supply.

17. The method of claim 12, comprising equalizing the first digit line with a third digit line of the first portion after the amount of the remaining charge has been transmitted from the first digit line and the second digit line.

18. A memory device, comprising:
a first digit line configured to supply a first voltage to a first plurality of sensing amplifiers during a refresh of a first section of memory banks of the memory device;
a second digit line configured to supply the first voltage to a second plurality of sensing amplifiers during a refresh of a second section of the memory banks;
a transistor configured to selectively couple the first digit line and the second digit line together to transmit excess charge remaining on the first digit line to the second digit line after the refresh of the first section and before the refresh of the second section;
a third digit line configured to supply a second voltage to a third plurality of sensing amplifiers during a refresh of the second section of the memory banks; and
an equalizer transistor configured to selectively couple the first and second digit lines together to equalize voltages of the first and third digit lines after the refresh of the first section.

* * * * *

UNITED STATES PATENT AND TRADEMARK OFFICE
CERTIFICATE OF CORRECTION

PATENT NO. : 10,614,876 B1
APPLICATION NO. : 16/176891
DATED : April 7, 2020
INVENTOR(S) : Scott E. Smith It is certified that error appears in the above-identified patent and that said Letters Patent is hereby corrected as shown below:

In the Claims

Column 13, Line 39, In Claim 12, insert a --:-- at the end of the preamble.

Signed and Sealed this
Seventh Day of July, 2020

Andrei Iancu
*Director of the United States Patent and Trademark Office*